United States Patent [19]

Nakayama et al.

[11] Patent Number: 4,733,102

[45] Date of Patent: Mar. 22, 1988

[54] PHASE ANGLE REGULATED RECTIFIER AND PULSE PRODUCING SYSTEM

[75] Inventors: Yutaka Nakayama; Kazutaka Tomimatsu, both of Kobe, Japan

[73] Assignee: Mitsubishi Jukogyo Kabushiki Kaisha, Tokyo, Japan

[21] Appl. No.: 888,053

[22] Filed: Jul. 22, 1986

[30] Foreign Application Priority Data

Jan. 30, 1986 [JP] Japan .................................. 61-16741
Jun. 5, 1986 [JP] Japan ............................. 61-85591[U]

[51] Int. Cl.$^4$ ............................................ H02M 9/06
[52] U.S. Cl. ..................................... 307/107; 55/105; 320/1; 363/86
[58] Field of Search ...................... 320/1; 55/105, 139; 323/903; 363/81, 83, 86; 307/132 R, 132 M, 107, 108

[56] References Cited

U.S. PATENT DOCUMENTS

| | | | |
|---|---|---|---|
| 2,000,017 | 5/1935 | Heinrich et al. ........................ | 55/139 |
| 2,565,005 | 8/1951 | Streuber ................................ | 307/107 |
| 3,059,394 | 10/1962 | Thomas et al. ........................ | 55/105 |
| 3,641,740 | 2/1972 | Schumann et al. ..................... | 55/139 |
| 4,665,476 | 5/1987 | Masuda ................................... | 323/903 |

FOREIGN PATENT DOCUMENTS 58-61843 4/1983 Japan .
59-63986 4/1984 Japan .
60-143849 7/1985 Japan .
60-152118 8/1985 Japan .
1090444 5/1984 U.S.S.R. .............................. 55/105

Primary Examiner—William H. Beha, Jr.
Attorney, Agent, or Firm—Birch, Stewart, Kolasch & Birch

[57] ABSTRACT

An impulse high voltage generator includes a step-up transformer for stepping up a voltage from an AC power source, a thyristor connected with a primary winding of the transformer for controlling the AC voltage from the AC power source by a firing angle, a full-wave rectifier and a capacitor which are connected with a secondary winding of the transformer, and a discharging resistor connected through a high-speed switching element to the secondary winding. The thyristor is turned on at a firing angle in accordance with a frequency which is set by a setting device for setting an impulse high voltage occurence frequency so that the capacitor is charged, while when the thyristor is turned off, the high-speed switching element is turned on to discharge the capacitor so that an impulse high voltage is generated across the discharging resistor. The impulse high voltage generator can vary a peak value and the occurrence frequency of the impulse high voltage simply and inexpensively with high efficiency.

4 Claims, 40 Drawing Figures

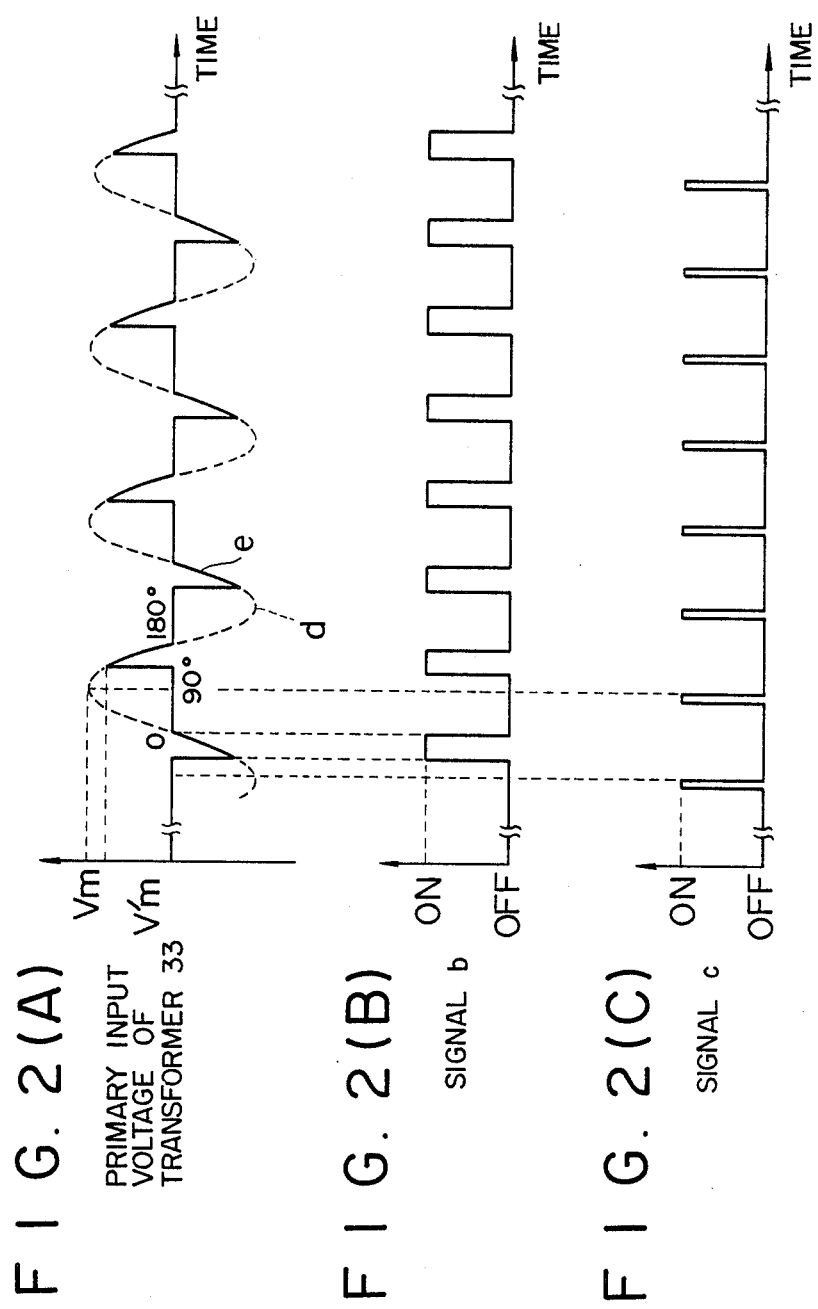

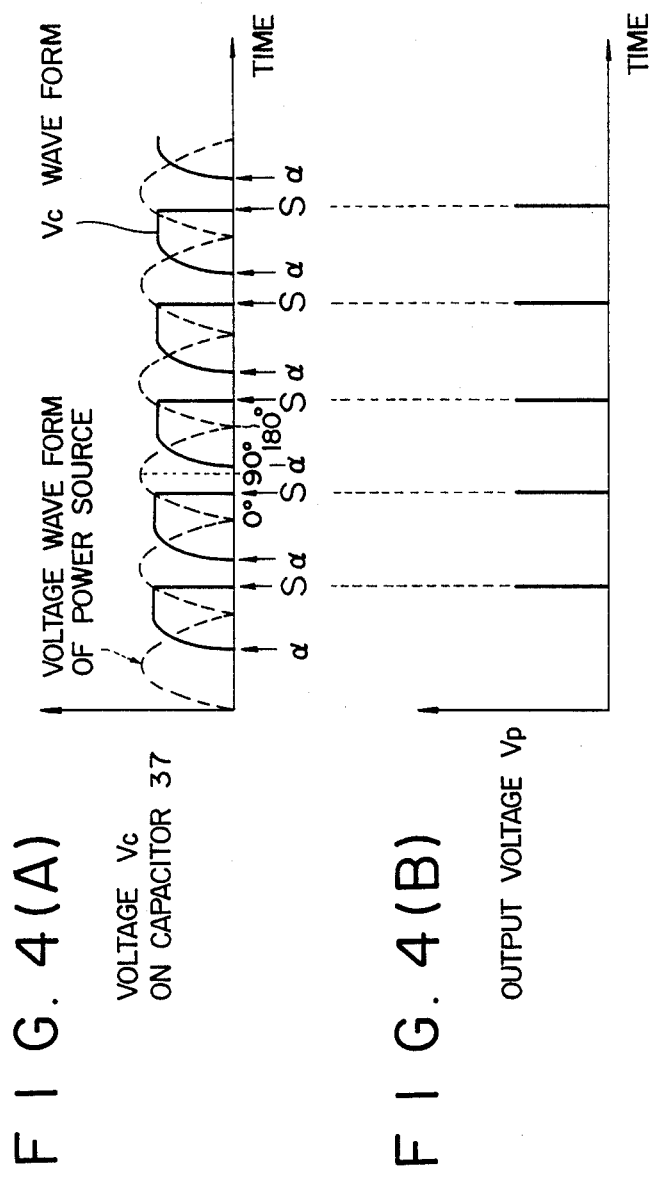

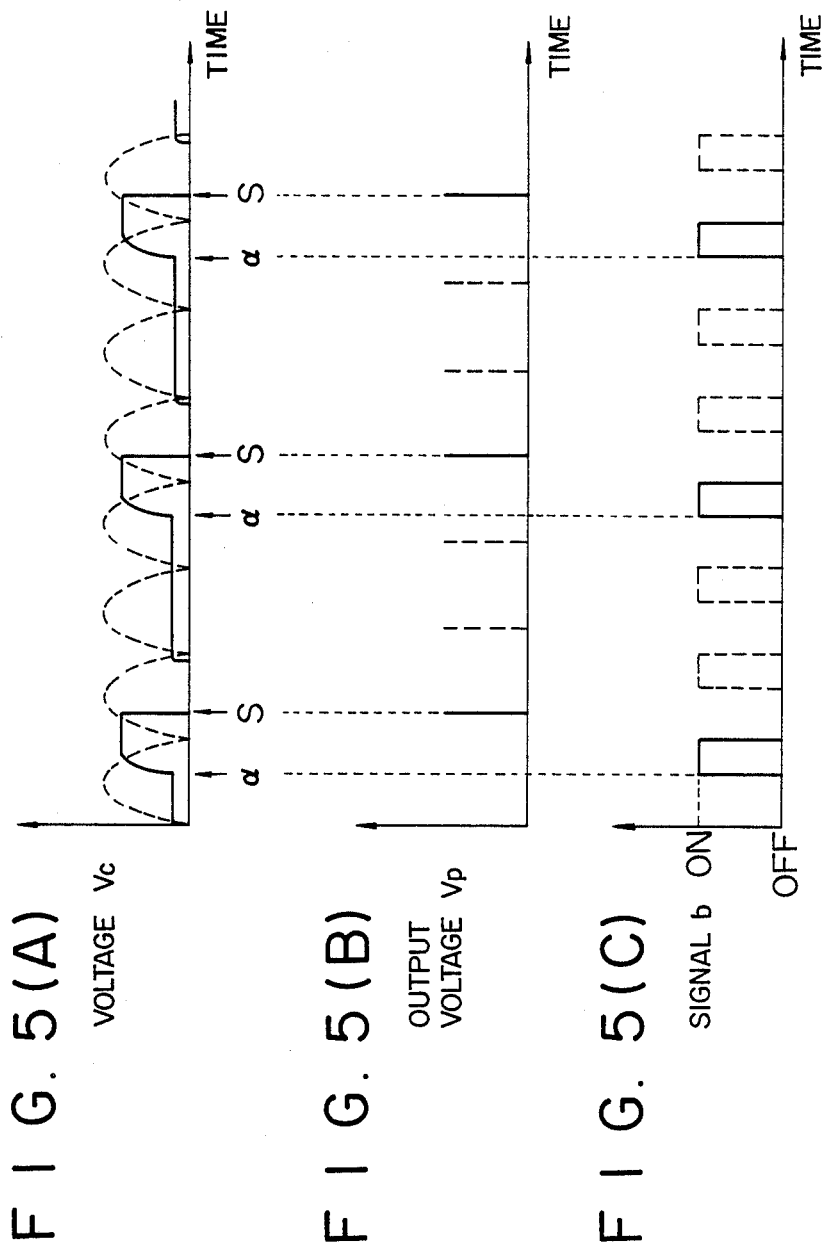

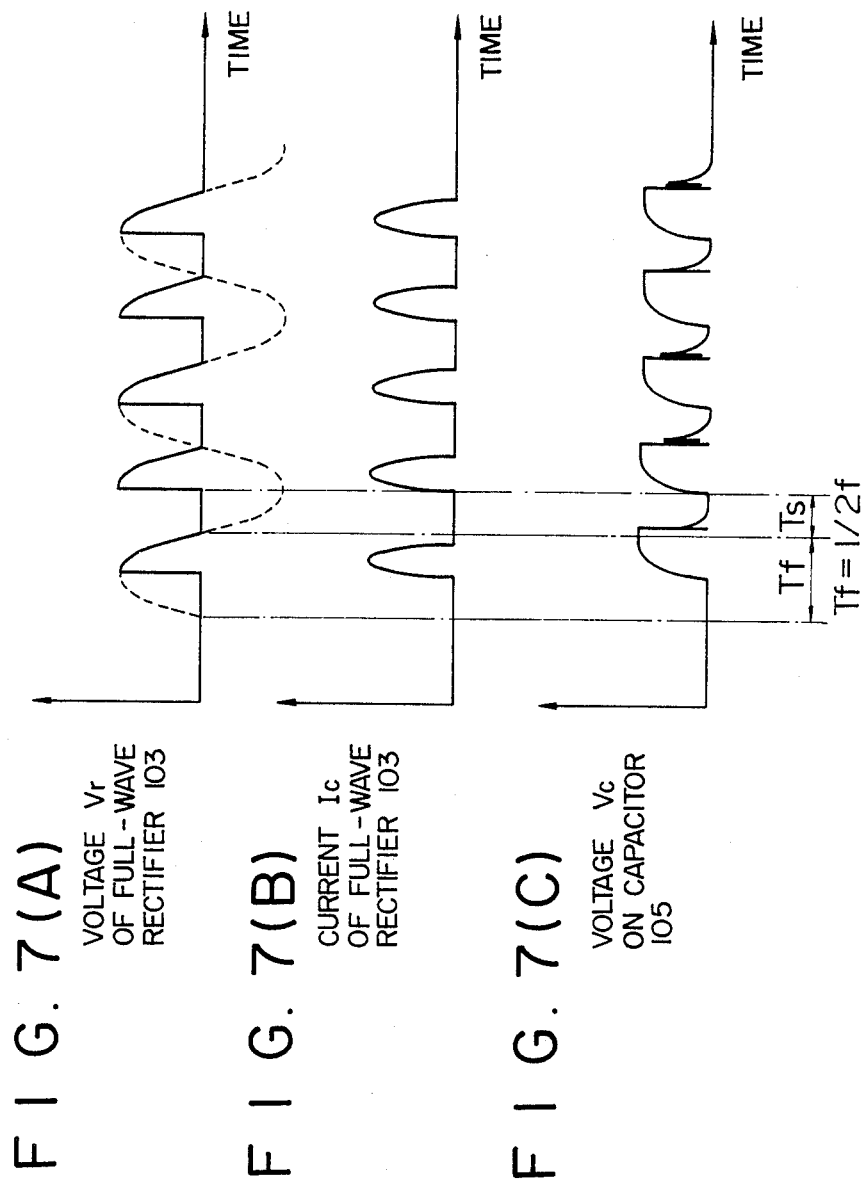

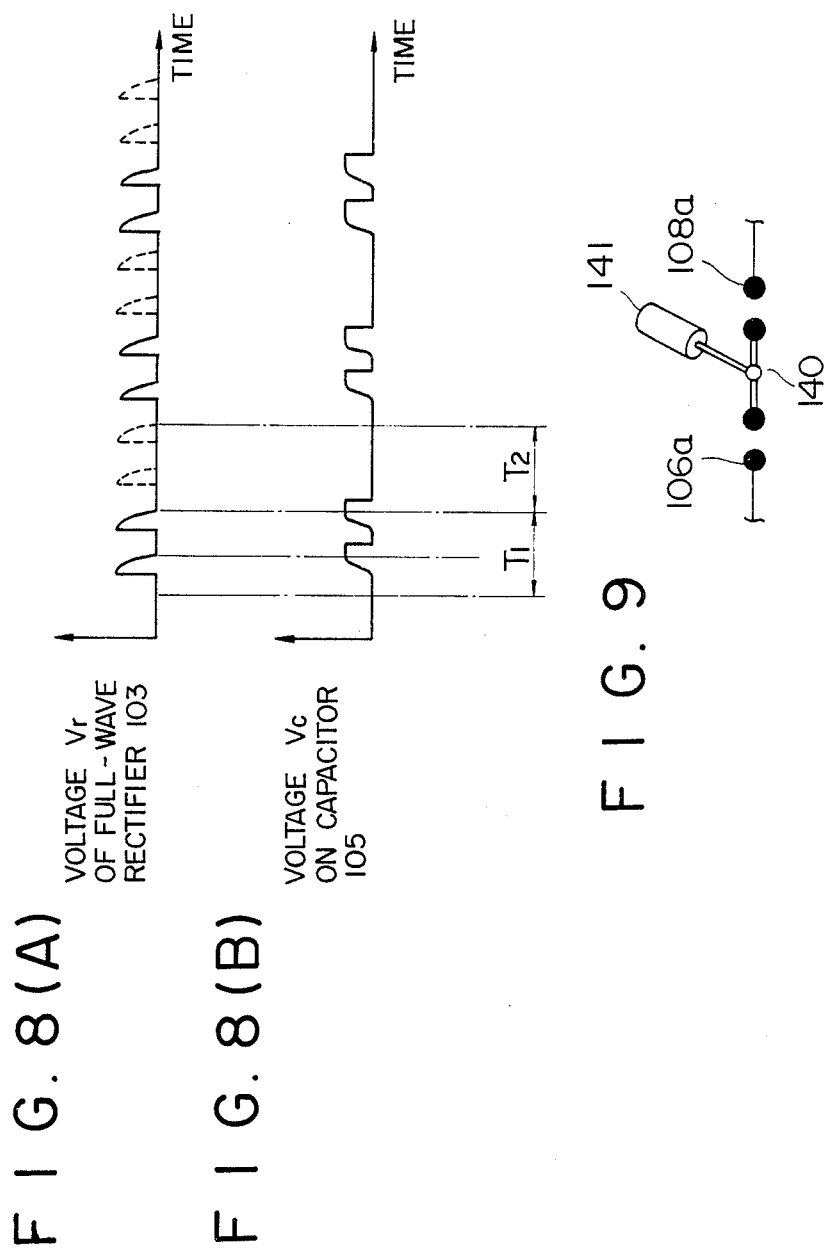

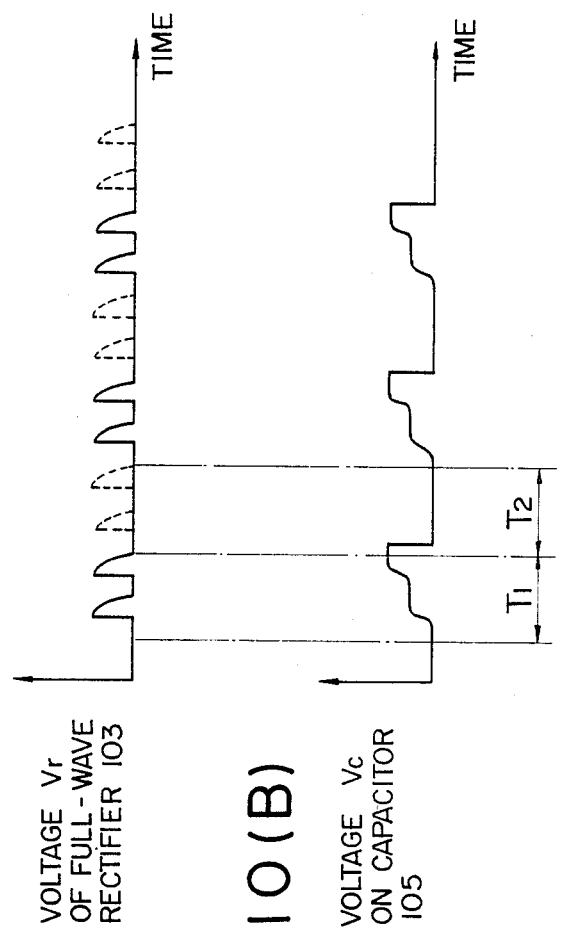

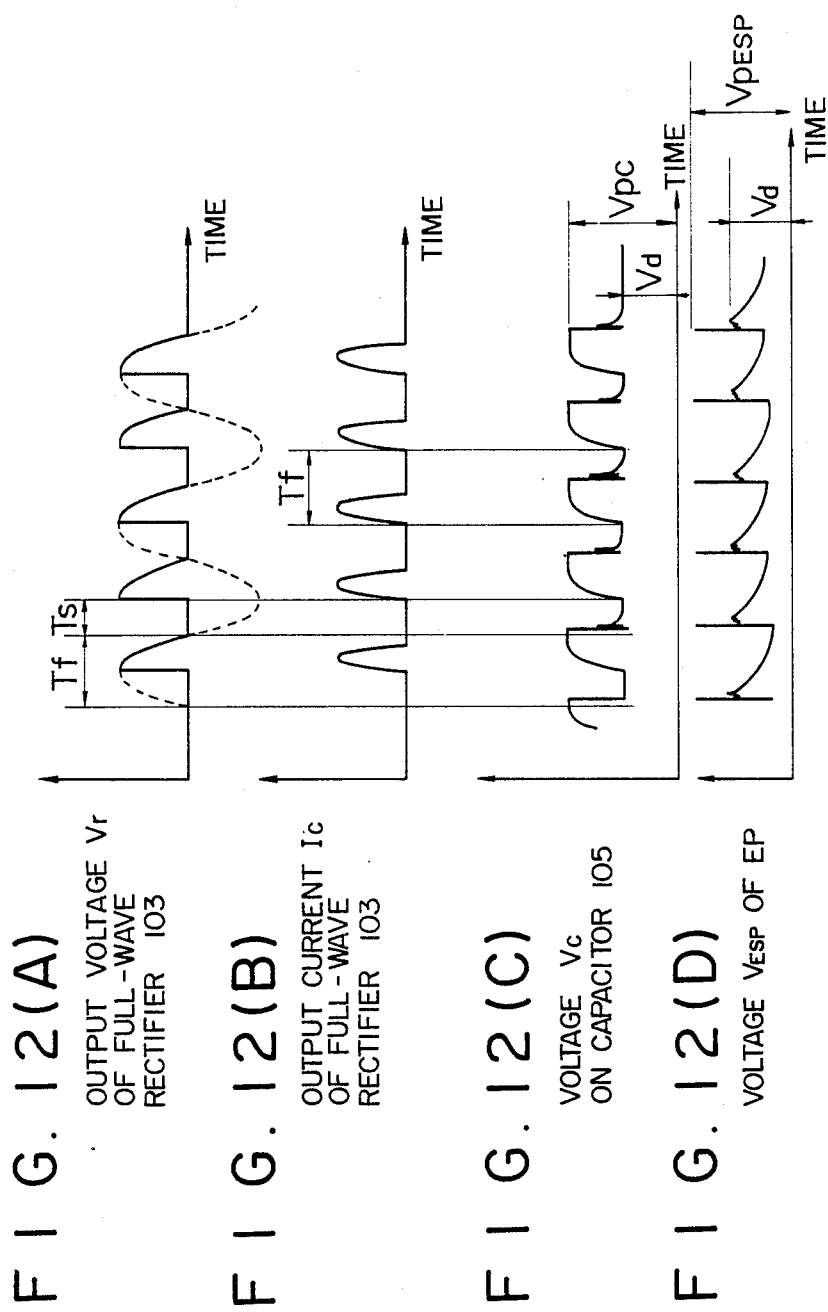

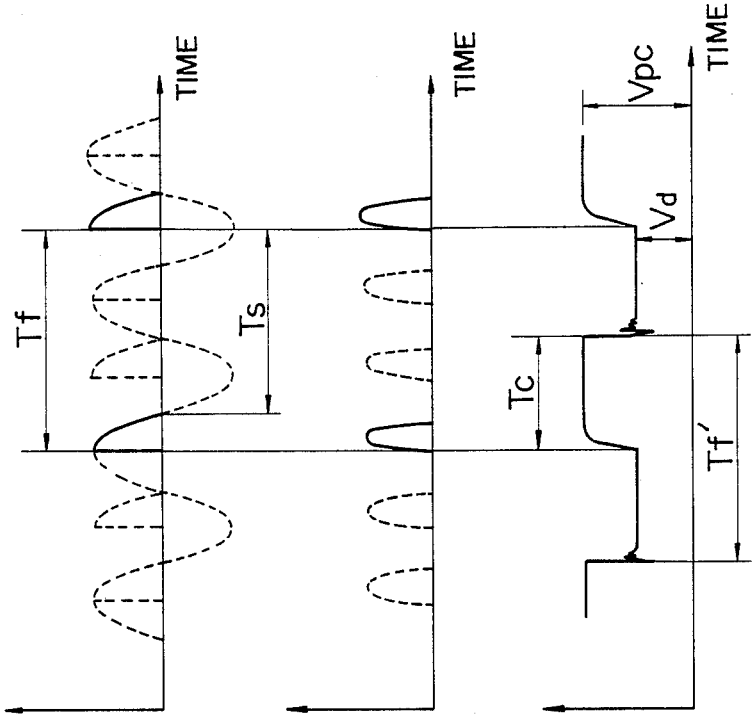
FIG. 13(A) OUTPUT VOLTAGE Vr OF FULL-WAVE RECTIFIER 103
FIG. 13(B) OUTPUT CURRENT Ic OF FULL-WAVE RECTIFIER 103
FIG. 13(C) VOLTAGE Vc ON CAPACITOR 105

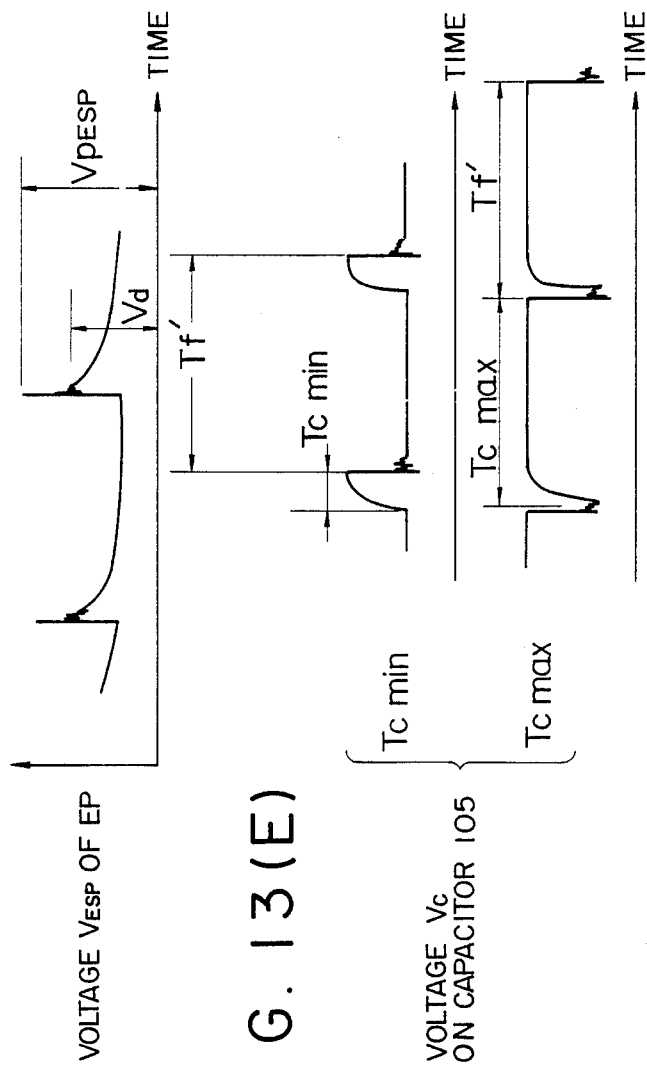

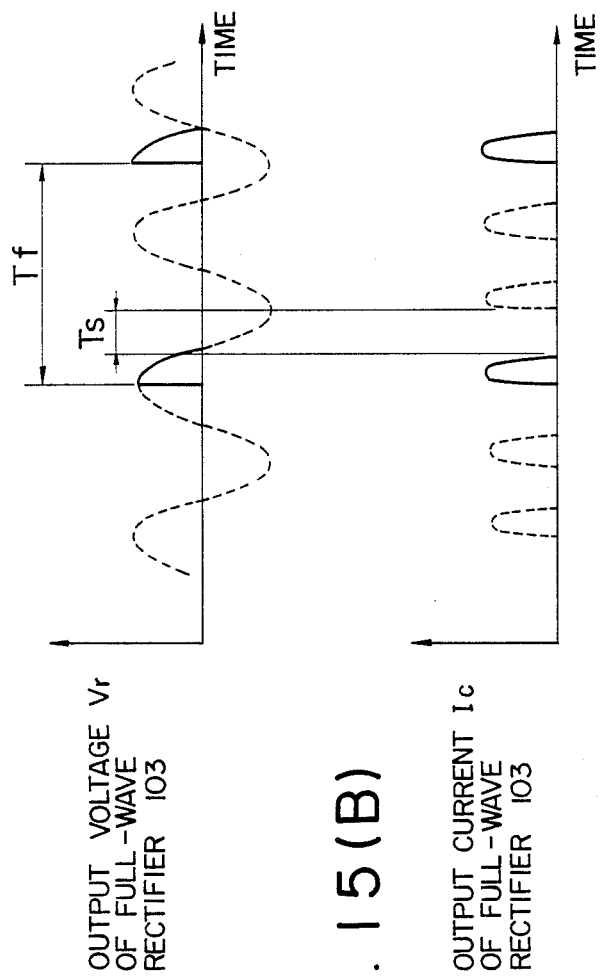
FIG. 15(A) OUTPUT VOLTAGE Vr OF FULL-WAVE RECTIFIER 103
FIG. 15(B) OUTPUT CURRENT Ic OF FULL-WAVE RECTIFIER 103

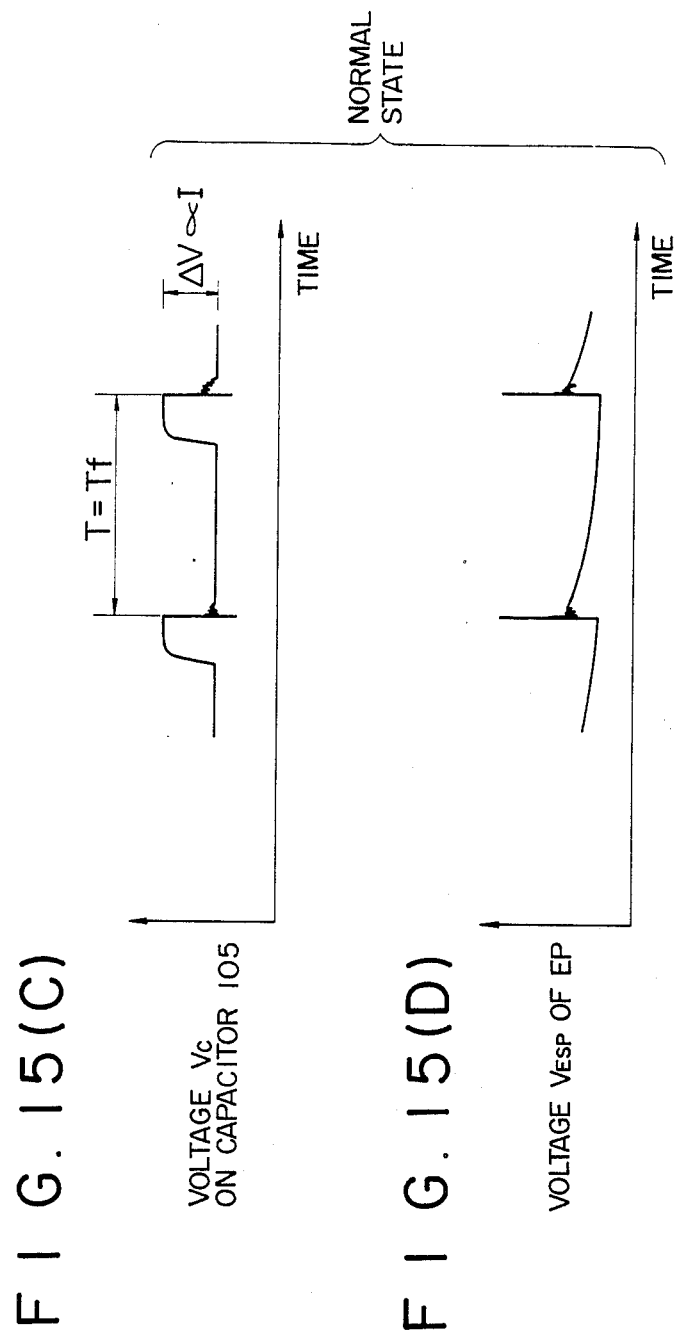

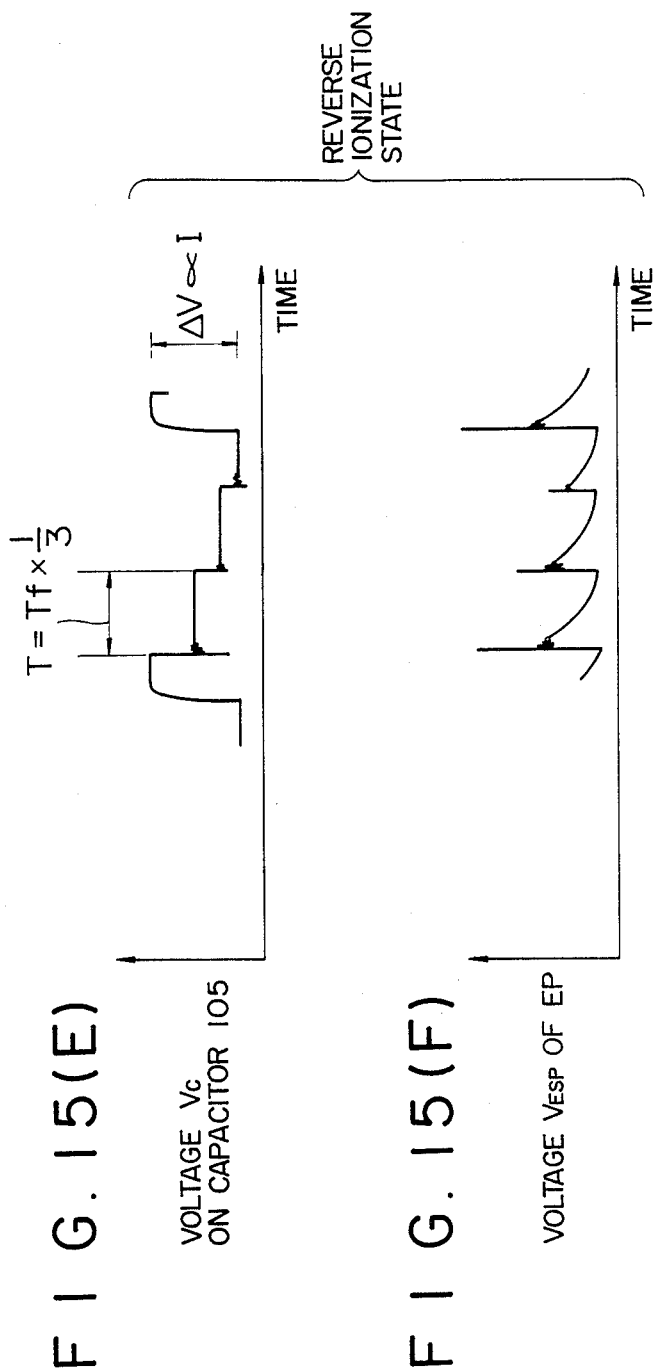

PHASE ANGLE REGULATED RECTIFIER AND PULSE PRODUCING SYSTEM

BACKGROUND OF THE INVENTION (i) Field of the Invention

The present invention relates to an impulse high voltage generator, and more particularly to a high voltage generator which can vary a peak value of an impulse high voltage and a frequency of generating the voltage simply and inexpensively with high efficiency.

(ii) Related Art Statement

In a conventional impulse high voltage generator, as shown in FIG. 16, an output voltage VTr of a DC high voltage power source 1 is impressed aross an energy storing capacitive element 5 such as a high voltage condenser and a high voltage coaxial cable through conductors 2, 3 and a current-limiting resistor 4 to charge the capacitive element. The electrical charge stored in the capacitive element is discharged to a discharging resistor 7 through conductors 8, 9 by means of a high-speed switching device 6 to impress an impulse high voltage to a load 12 through output terminals 10 and 11. The high-speed switching device 6 mainly utilizes a spark gap for use in the impulse high voltage generator, and the spark gap includes electrodes 13 and 14 spaced from each other properly and enclosed with insulating gas of a proper type and having proper pressure. The high-speed switching device 6 may be a hydrogen thyratron or a high-speed thyristor.

When the high-speed switching device 6 is the spark gap, the high-speed switching divice 6 has a distance between the electrodes adjusted so that the spark voltage Vs is a value lower than the output voltage VTr of the DC high voltage source 1. When the voltage Vc across the capacitive element 5 reaches the spark voltage Vs in the course of the charging operation, spark is produced across the electrodes 13 and 14 to short-circuit between both the electrodes immediately and the electrical charge stored in the capacitive element 5 is discharged through the conductors 8 and 9, the spark gap 15 and the discharging resistor 7 to generate a sharply rising impulse high voltage across the output terminal 10 and 11.

The above-mentioned spark gap is of self-blasting type. Alternatively, in order to start the spark gap, an externally controlled spark gap has been used in which the voltage Vc is established to be Vs>Vc and a pulse voltage is superposed on the voltage Vc to trigger the spark gap, or in which a third trigger electrode is provided between the electrodes 13 and 14 and a trigger pulse voltage is applied to the third trigger electrode.

The conventional well-known impulse high voltage generator shown in FIG. 16 has large drawbacks described below irrespective of the self-blasting type and the externally controlled type.

(1) When the energy storing capacitive element (hereinafter referred to as a capacitor) 5 is charged, the output voltage VTr of the DC high voltage source 1 is impressed through a series circuit of the current-limiting resistor 4 and the capacitor 5 to the condenser 5. The current-limiting resistor 4 dissipates energy equal to energy of $CVc^2/2$ supplied to the capacitor 5 having a capacitance C as Joule loss, resulting in remarkable power loss.

(2) Since the current-limiting resistor 4 suppresses a current flowing from the DC high voltage source 1 when the high-speed switching device 6 is turned on, the resistor 4 has a large resistance value such as 0.5–10 megohms. This is because the spark of the high-speed switching device 6 is shifted to a continuous arc discharge and the current of $I=VTr/(Rc+Rm)$ flows continuously if the current from the DC high voltage source 1 is not suppressed when the switching device 6 is turned on. In the equation of the current, VTr is the output voltage of the DC high voltage source 1, Rc is a resistance value of the current-limiting resistor 4, and Rm is a resistance value of the discharging resistor. The resistance value Rc of the current-limiting resistor 4 is largely related to a time constant $\tau=Rc\cdot C$ for charging the capacitor 5. If the resistance value Rc is increased excessively, the time constant becomes large and the impulse high voltage can not be generated frequently to limit the frequency of generating the impulse high voltage. On the other hand, if the resistance value Rc is decreased, the above-mentioned continuous current becomes large. Accordingly, the resistance value Rc is not decreased too small. In any event, the current-limiting resistor 4 requires large resistance value of 0.5–10 megaohms, large power capacity, and cooling facilities because of the reason described in the above item (1).

In order to solve the problems described in the above items (1) and (2), Japanese Patent Application No. 56-144399 entitled "Vary Short Pulse High Voltage Generator" filed in 1981 in the name of Senichi Masuda discloses that the current-limiting resistor 4 of FIG. 16 is removed as shown in FIG. 17 and an AC high voltage power source 21 is used in place of the DC high voltage power source 1. A rectifier 22 is connected to an end of an output of the source 21 and a capacitor 23 is charged through the rectifier 22 from a zero voltage to an AC output peak voltage Vm, so that power loss for charging is suppressed to extremely small value in principle. The high-speed switching device 24 uses the externally controlled high-speed synchronizing switch which switches at a high speed at a predtermined time in synchronism with the AC voltage and the synchronizing switch is turned on during a half cycle of the AC high voltage when the polarity of the AC high voltage is inverted so that the rectifier 22 prevents the capacitor 23 from being discharged. Thus, the electrical charge stored in the capacitor 23 is discharged through a discharging resistor 25. However, this apparatus of the power frequency synchronizing type has also drawbacks described below.

(1) The half-wave rectification type DC high voltage power sorce is used for a power source for charging the capacitor actually, and since the voltage at the secondary side of the high voltage transformer is half-wave rectified, the primary AC current is unsymmetrical and the distorted excitation of the transformer tends to be produced. Accordingly, the countermeasures such as increasing the capacity of the transformer and use of a center-tapped transformer (FIG. 18) are required.

(2) Since the above apparatus operates in synchronism with the frequency of the power source completely and the capacitor 23 is charged by the half-wave of the AC high voltage power source 21, the occurrence frequency of the impulse high voltage is fixed to 50 or 60 times per second (equal to the power frequency). Accordingly, the occurrence frequency can not be changed and the frequency exceeding 50 or 60 times per second can not be realized.

SUMMARY OF THE INVENTION

The present invention has been made in view of the above drawbacks.

An object of the present invention is to provide an impulse high voltage generator in which the occurrence frequency of the impulse high voltage can be varied in the wide range containing twice the maximum power frequency with small power loss.

In order to achieve the above object, the present invention is structured as follows.

(I) The impulse high voltage generator is characterized by the provision of a step-up transformer for stepping up an AC voltage from an AC power source, a thyristor connected to the primary winding (the power source side) the transformer for controlling the AC voltage by a firing angle, a full-wave rectifier connected to the secondary winding of the transformer, a capacitor connected to an output of the full-wave rectifier, a high-speed switching device connected to the capacitor, a discharging resistor connected to the high-speed switching device, a setting device for setting an occurrence frequency of the impulse high voltage, and a control device for turning on the thyristor at a firing angle in accordance with the occurrence frequency of the impulse high voltage set by the setting device to charge the capacitor and turning on the high-speed switching device during turning off of the thyristor to discharge the capacitor so that the impulse high voltage is generated across the discharging resistor.

(II) The impulse high voltage generator is characterized by the provision of a step-up transformer for stepping up an AC voltage from an AC power source, a thyristor connected to the primary winding (the power source side) of the transformer for controlling the AC voltage by a firing angle, a full-wave rectifier connected to the secondary winding of the transformer, a capacitor connected to an output of the rectifier, a high-speed switching device for supplying a voltage generated in the capacitor to an output terminal, a setting device for setting an occurrence frequency of the impulse high voltage, a current detector for detecting a primary current of the transformer, a first voltage detector for detecting a voltage across the capacitor, a second voltage detector for detecting a voltage across the output terminal, and a control device for turning on the thyristor at a firing angle in accordance with the occurrence frequency of the impulse high voltage set by the setting device and detection signals of the current detector and the first and second voltage detectors to charge the capacitor and for turning on the high-speed switching device during turning off of the thyristor to supply the voltage of the capacitor to the output terminal so that the impulse high voltage is generated to the output terminal.

(III) The impulse high voltage generator is characterized by the provision of a step-up transformer for stepping up an AC voltage from an AC power source, a thyristor connected to the primary winding (the power source side) of the transformer for controlling the AC voltage by a firing angle, a full-wave rectifier connected to the secondary winding of the transformer, a capacitor connected to an output of the rectifier, a high-speed switching device for supplying a voltage generated in the capacitor to an output terminal, a synchronous motor for rotatively driving the high-spaed switching device, a frequency converting device for driving the synchronous motor in synchronism with the frequency of the AC power source or the frequency obtained by dividing the frequency of the AC power source by the integral number, a setting device for setting an occurrence frequency of the impulse high voltage, a current detector for detecting a primary current of the transformer, a first voltage detector for detecting a voltage across the capacitor, a second voltage detector for detecting a voltage across the output terminal, and a control device for turning on the thyristor at a firing angle in accordance with the occurrence frequency of the impulse high voltage set by the setting device and detection signals of the current detector and the first and second voltage detectors to charge the capacitor and for controlling the frequency converting device to drive the synchronous motor so that the high-speed switching device is turned on during turning off of the thyristor to supply the voltage of the capacitor to the output terminal to generate the impulse high voltage to the output terminal.

Operation is as follows.

According to the above structures (I) and (II), the high-speed switching device which is driven by the same AC power source as the high voltage charging power source adopts a mechanically rotating spark gap using a synchronous motor, for example. The high voltage charging power source charges the capacitor in accordance with the frequency of the AC voltage and after charging the capacitor the mechanically rotating spark gap is set to be turned on during a period of blocking current by the thyristor or a semiconductor forming a power adjusting device at a low voltage side of the high voltage charging power source until the capacitor begins to be charged again. The operation is repeated in synchronism with the frequency of the AC power source perfectly without any rush current into a load from the power source in the process from "charging of the capacitor" to "turning on of the spark gap" when the spark gap is on. Accordingly, the current-limiting resistor is not required and can be removed, and by turning on and off the thyristor or the semiconductor forming the power adjusting device in synchronism with the frequency of the AC power source, a peak value of the impulse high voltage and the charging frequency of the capacitor, that is, the occurrence frequency of the pulse high voltage can be varied easily.

In the above structure (III), according to the present invention, the rotation of the mechanically rotating spark gap is controlled by the synchronous motor driven through the frequency converting device by the same AC power source as the DC high voltage generator and the rotational number of the synchronous motor is changed by variation of the frequency in interlocked relationship with thinned operation of the thyristor and in accordance with the frequency of the thinning rate or an intermittently charging rate. The frequency of the frequency converting device is increased or decreased slightly with regard to the established frequency by the control device so that the mechanically rotating spark gap is turned on when the thyristor is off by feeding back the voltage wavefrom signal and the like. Accordingly, the frequency of generating pulses can be varied exactly even for high resistive dust without any rush current into a load means of the rotating spark gap in response to the intermittent operation of the thyristor.

With the above structures, the present invention possesses the following effects. Since the high-speed switching device, for example, the mechanically rotating spark gap which switches in synchronism with the current blocking period of the thyristor is used, the current-limiting resistor, which has been used heretofore, is not required and hence the power loss is almost eliminated. The high voltage pulse occurrence frequency can be very easily varied in the wide range containing twice the maximum power frequency by changing the frequency of the AC power source or by turning on and off the thyristor.

BRIEF DESCRIPTION OF THE DRAWINGS

FIGS. 2(A), (B) and (C) are timing charts showing a basic operation in FIG. 1;

FIG. 4 is a timing chart in actual operation;

FIGS. 5(A) to 5(C) are a timing charts showing another operation;

FIGS. 7(A), (B) and (C) and FIGS. 8(A) and (B) are timing charts for explaining operation in FIG. 6;

FIG. 9 is a circuit diagram showing another embodiment;

FIGS. 10(A) and (B) show timing for explaining operation in FIG. 9;

FIGS. 12(A) to 12(D) and FIGS. 13(A) to 13(E) show timing of operation of each portion of FIG. 11;

DETAILED DESCRIPTION OF PREFERRED EMBODIMENTS

[First Embodiment]

Figure 1:
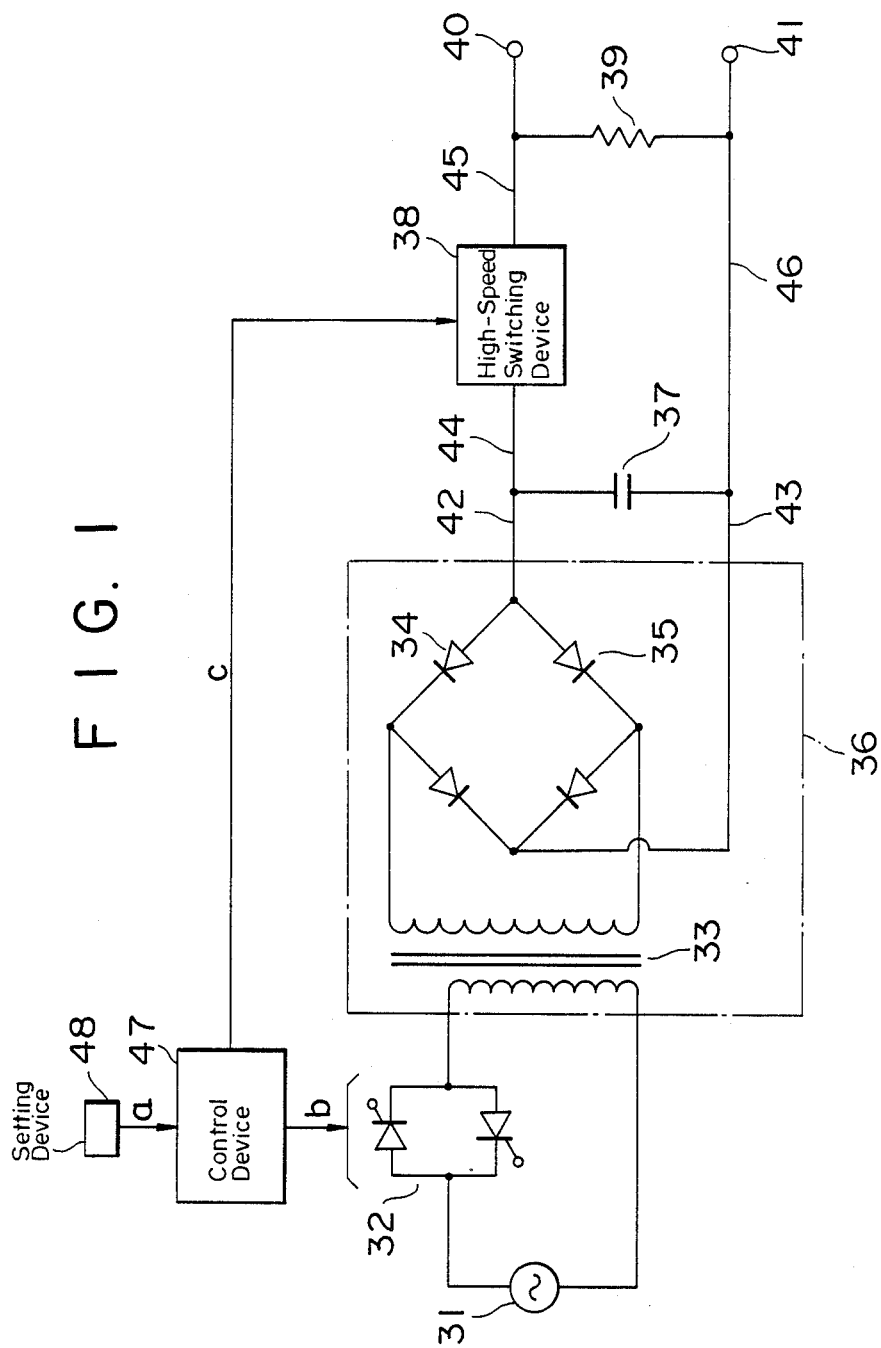
FIG. 1 is a circuit diagram of an impulse high voltage generator according to a first embodiment of the present invention.

In FIG. 1, numeral 31 denotes an AC power source having a frequency f of 50 or 60 Hz. An output DC high voltage of a DC high voltage power source 36 including the AC power source 31, thyristors 32 for controlling the AC power, a step-up transformer 33 and a full-wave rectifier 35 having rectifiers 34 which are bridge-connected with each other is supplied to a capacitor 37 through conductors 42 and 43. An end of the capacitor 37 is connected through a conductor 44, an externally controlled high-speed switching device 38, a conductor 45, a discharging resistor 39 and a conductor 46 to the other end of the capacitor 37. Output terminals 40 and 41 are connected across the discharging resistor 39. On the other hand, the thyristors 32 are supplied with a control signal (firing command) b from a control device 47 in accordance with the occurrence frequency a of the impulse high voltage which is set by a setting device 48. The control device 47 supplies a high-speed command signal c to the externally controlled high-speed switching device 38.

Operation is now described. When the signal b from the control device 47 is supplied to the thyristors 32 at a timing as shown in FIG. 2 (B), for example, a waveform of an output voltage at an output side of the thyristors 32 is as shown by e of FIG. 2(A), in which d is a voltage waveform of the AC power source 31. The output of the DC high voltage power source 36 is applied to the capacitor 37 through the conductors 42 and 43. The capacitor 37 is thus charged and the output high voltage waveform at this time is substantially equal to the voltage waveform shown in FIG. 2(A). Accordingly, the capacitor 37 is substantially charged to a voltage Vm' shown in FIG. 2(A). A maximum value of the charged voltage to the capacitor 37 is a peak value of the output voltage, that is, a value obtained by multiplying a peak value of the power voltage by a transformation ratio of the transformer 33. The firing angle of the thyristors 32 is controlled between 90° and 180° of the phase angle of the power voltage actually since the charged voltage Vc of the capacitor 37 is not changed between 0° and 90° of the power voltage phase angle as apparent from FIG. 2(A).

Figure 3A:
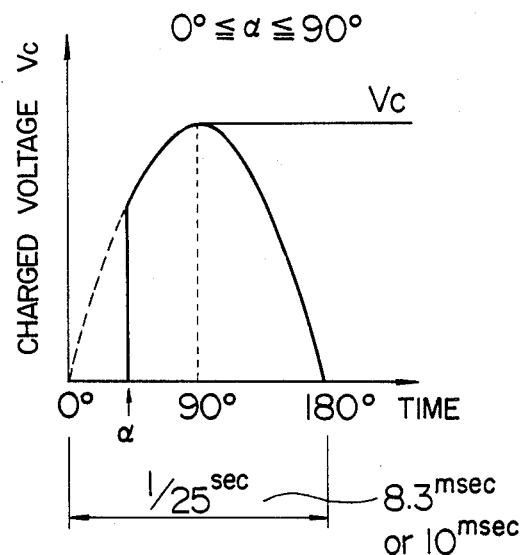
FIGS. 3(A) and (B) show relation between a firing angle α and a charging voltage Vc.
Figure 3B:
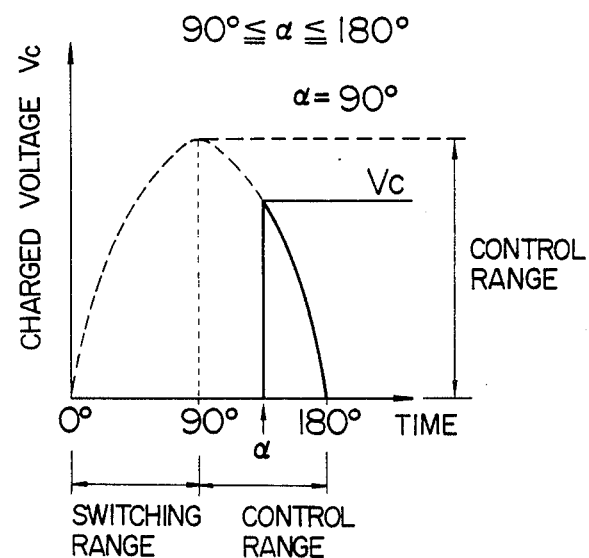

In FIG. 3(A), a charged voltage Vc is shown when the firing angle α is from 0° to 90°, and in FIG. 3(B) a charged voltage Vc is shown when the firing angle α is from 90° to 180°. Since the charged voltage Vc is maximum and is not changed between 0° and 90° of the firing angle α, the charged voltage can be controlled only between 90° and 180°. More particularly, such a control manner using the thyristors can provide a non-conductive period between 0° and 90° of the phase angle of the power voltage. Thus, if the first high-speed switch 38 of FIG. 1 is operated, that is, turned on during the non-conductive period, the power or current from the power source 36 can be prevented from flowing into the loads (that is, the discharging resistors 39 and a load connected across output terminals 40 and 41). Accordingly, the shift to arc discharge in the high-speed switching device 38 due to continuous current can be prevented. More particularly, the control device 47 supplies the operation command signal c to the high-speed switching device 38 at the timing corresponding to the non-conductive period of the thyristors as shown in FIGS. 2(A), (B) and (C) so that the high-speed switching device 38 is turned on at this timing and the electrical charge of the capacitor 37 is discharged through the conductor 44, the high-speed switch 38 and the conductors 45, 46 to the discharging resistors 39, thereby generating the impulse high voltage having sharply rising edge at the output terminals 40 and 41.

FIGS. 4(A), (B) show the voltage Vc across the capacitor 37 and the output voltage Vp, that is, the impulse high voltage generated between the output terminals 40 and 41 in actual operation. As shown in FIG. 4(A), when the thyristor control signal b is applied to the thyristors at the timing the thyristors 32 are fired and the capacitor 37 is charged. When the output voltage of the DC high voltage power source 36 is equal to the voltage Vc of the capacitor, the charging operation to the capacitor is terminated and the voltage Vc is held. Then, the high-speed switch 38 is supplied with the operation command signal c at a predetermined timing S between the power phase angles 0° and 90° and the high-speed switch 38 is turned on. As apparent from FIG. 4(B), the high-speed switch 38 is operated after each half wave and hence the output voltage Vp, that is, the impulse high voltage is generated at that twice the power frequency, that is, at the frequency of 100 or 120 per second where the power frequency is 50 or 60 Hz.

On the other hand, when the thyristor control signal b is generated intermittently as shown in FIG. 5(C), the occurrence frequency of the output voltage Vp can be varied to any value as shown in FIG. 5(B). The occurence frequency of FIG. 5(B) is one-third the frequency of FIG. 4(B). That is, the thyristor control signal b is thinned to a value, for example ½, ⅓ or ¼, on the basis of the predetermined setting value of the setting device 48 of FIG. 1 and the high-speed switch operation command c is produced accordingly so that the occurrence frequency of the impulse high voltage can be varied to any value in the range of 0 to 2f where the frequency f is 50 or 60 Hz.

As described above, according to the present embodiment, the following effects are attained.

(1) Since any current-limiting resistor is not required to be connected with the output of the DC high voltage power source 36, the capacitor 37 can be charged efficiently with very small charging time constant and the power loss upon charging the capacitor can be eliminated substantially.

(2) Since the high-speed switch 38 is turned on during the non-conductive period of the thyristors 32 connected to the power side of the DC high voltage power source 36, continuous current does not flow from the power side to the load.

(3) Since the DC high voltage power source uses the full-wave rectifier, the distorted excitation is not produced in the transformer and cheap standard components can be used as compared with the power frequency synchronizing type apparatus required to use the half-wave rectifier.

(4) While the occurrence frequency of the impulse high voltage in the power frequency synchronizing type apparatus is fixed to the power frequency f (50 or 60 Hz) and is 50 or 60 times per second, the occurrence frequency in the thyristor controlled synchronizing type impulse high voltage generator according to the present invention can be increased to maximum 100 or 120 times per second. Further, the occurrence frequency can be easily established and changed to one-half, one-third or the like of the maximum frequency by control of the thyristor which is the existing technique.

(5) Since the present invention possesses the above effects, when the impulse high voltage generator of the present invention is used as a pulse generator for an electrostatic precipitator, high efficient operation with safety and saving energy is attained.

[Second Embodiment]

Figure 6:
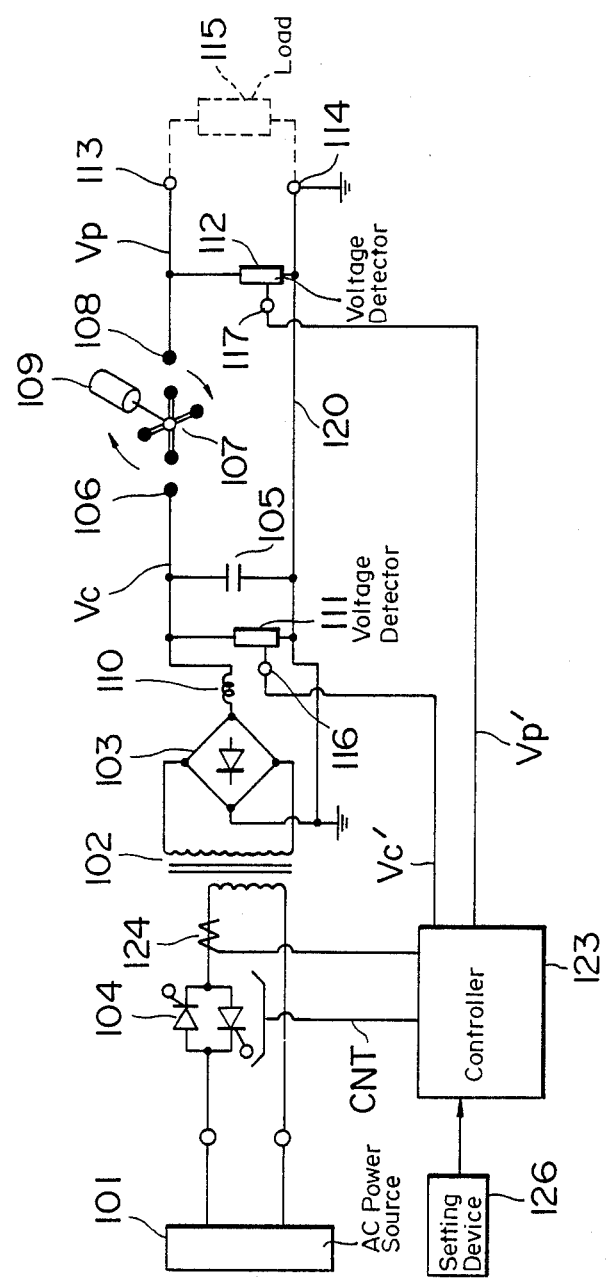
FIG. 6 is a circuit diagram of an impulse high voltage generator according to a second embodiment of the present invention.

Referring to FIG. 6, an AC power source 101 is connected through an AC power control thyristors 104 to a primary winding of a step-up transformer 102. A secondary winding of the transformer 102 is connected to a full-wave rectifier 103. An output of the rectifier 103 is supplied to a capacitor 105 through a DC reactor 110. An end of the capacitor 105 is connected through a spark gap to a terminal 113. The spark gap, which is a kind of high-speed switching device, comprises an input electrode 106, an output electrode 108, a rotating electrode 107 equiped with four electrodes which are mounted on a common shaft at equal intervals of 90° and a synchronous motor 109 which rotates the rotating electrode 107 at a synchronous speed determined by a frequency of the AC power source. A load 115 is connected between the terminal 113 and a ground terminal 114.

A current detector 124 is connected to the primary winding of the step-up transformer 102 to detect a primary current, and the detected value of the current detector 124 is supplied to a controller 123. A voltage Vc across the capacitor 105 is detected by a voltage detector 111 and the detected voltage Vc is supplied to the controller 123. An output voltage Vp between the terminals 113 and 114 is detected by a voltage detector 112 and the detected voltage Vp' is supplied to the controller 123. The controller 123 produces a control signal, that is, a firing angle control signal CNT for the thyristors 104 on the basis of the signals from the detectors 124, 111 and 112 and a high voltage occurrence frequency supplied from an external command setting device 126 of a manual type or any other type.

When two opposed electrodes of the four rotating electrodes 107 of the mechanically rotating spark gap are aligned with an axial line connecting the input electrode 106 and the output electrode 108 so that the opposed electrodes of the rotating electrodes 107 come nearest to the input and output electrodes 106 and 108 and the capacitor 105 is charged to a voltage enough to produce spark between gaps, the spark gap conducts, that is, is switched on by spark discharge.

In the preferred embodiment, the synchronous motor 109 is a four-pole motor which rotates at rotational speed of 1500 or 1800 rpm if the frequency f is, for example, 50 or 60 Hz, and the output shaft and a rotor of the motor make one rotation for two periods of the AC power source 101. That is, since there are four switch timings of the gap, when the rotor of the motor makes one rotation, the spark gap is switched once for each half cycle of the AC power source in synchronism with the frequency of the AC power source.

Accordingly, if the capacitance of the capacitor 105 is selected so that the capacitor 105 is sufficiently charged to a predetemined voltage Vc during a half cycle of the power frequency, a current blocking period for the thyristor 104 shown by Ts of FIGS. 7(A), (B), (C) can be produced. Accordingly, if the switch timing of the spark gap is adjusted and set to the current blocking period as described above, the switching the spark gap is synchronized with the power frequency perfectly and hence the occurrence of impulse high voltage can be repeated stably without rush current flowing into the load 115 from the full-wave rectifier 103. This is because since an output voltage Vr of the rectifier 103 is as shown in FIG. 7(A) and current Ic of the rectifier 103 is reduced to zero prior to the switch timing of the spark gap as shown in FIG. 7(B), any current does not rush into the load upon switch-on. FIG. 7(C) shows a waveform of the voltage Vc across the capacitor 105 at this time. When the thyristors 104 are turned on and off in synchronism with the power frequency, the charging frequency of the capacitor 105, that is, the occurrence frequency of the impulse high voltage can be varied. That is, if the charging operation of the capacitor 105 and the switching operation of the spark gap (that is, the occurrence of the impulse high voltage) are repeated for each half cycle ½f of the frequency f of the AC power source as shown in FIG. 7(C), the occurrence frequency of the impulse high voltage is 2f times per second. However, as shown in FIGS. 8(A), (B), if ON time shown by T1 and OFF time shown by T2 are repeated in synchronism with the frequency of the AC power 101, the occurrence frequency is 2f×T1/(T1+T2). The impulse frequency in FIG. 8(B) of f times per second. In order to avoid the distorted excitation of the step-up transformer 102, since it is desired that the AC current at the low voltage side of the transformer flows symmetrically so that positive current is symmetrical with negative current, the OFF time T2 is generally set to an integral multiple of one period of the AC power source. When there is a margin in the capacity of the step-up transformer, there is no problem and hence there is not provided any limitation in the present embodiment.

The occurrence frequency of the impulse high voltage described above is carried out by the control signal CNT of the controller 123. The controller 123 is supplied with the output voltage Vc' of the voltage detector 111 connected between the full-wave rectifier 103 and the ground 120 in parallel wtih the capacitor to detect the voltage Vc across the capacitor 105, the output voltage Vp' of the voltage detector 112 connected between the output of the spark gap and the ground 120 in parallel with the load 115 to detect the output voltage Vp, the detected signal of the current detector 124 and the impulse high voltage occurrence frequency command from the external command setting device 126 of the manual type or any other type. The controller 123 supplies the control signal to the thyristors 104 on the basis of these input values to control the firing angle of the thyristors 104 for the AC voltage.

The DC reactor 110 is provided to prevent current from flowing out suddenly from the charging power source when the spark gap or the capacitor 105 is short-circuited.

In this embodiment, when the commertially available power source is used as the AC power source 101, the occurrence frequency fp of the impulse high voltage can be easily varied in the following range by setting the periods T1 and T2.

$o < fp \leq 100$ times/second for 50 Hz $0 < fp \leq 120$ times/second for 60 Hz When a variable frequency AC power source such as an inverter is used as the AC power source 101, the occurrence frequency can be varied in the following range depending on the variable frequency f.

$0 < fp \leq 2f$ times-second

Accordingly, variation of the frequency f can provide higher occurrence frequency of the impulse high voltage as compared with the commertially available power source.

In this case, since the synchronous motor 109 is connected with the same AC power source as the charging power source, the charging operation of the capacitor 105 by the charging power source is synchronized with the switching operation of the spark gap. Accordingly, it is needless to say that the impulse high voltage is stably generated repeatedly even if the frequency of the AC power source 101 is varied.

Another embodiment of the present invention is now described. The embodiment is to utilize a spark gap including an input electrode 106a, an output electrode 108a and two-pole type rotating electrode 140 as shown in FIG. 9.

In this case, when the four-pole synchronous motor is used as the synchronous motor 141 as described above, since the spark gap, is switched for each cycle of the power frequency, the maximum occurrence frequency fp of the impulse high voltage obtained is f times per second where f is the power frequency. By setting the ON time T1 and the OFF time T2 of the thyristors 104, the occurrence frequency of the impulse high voltage can be varied in the following range.

$0 < fp \leq f$

FIGS. 10(A), (B) show an example of a timing chart illustrating operation of FIG. 9.

On the other hand, when the two-pole motor is used as the synchronous motor 141 where the rotational speed is 3000 or 3600 rpm for the power frequency f=50 or 60 Hz, the rotational speed is twice the four-pole synchronous motor. Accordingly, if the two-pole type rotating electrode 140 is used for the spark gap, the same operation as the embodiment of FIG. 6 can be made.

As described above, according to the present embodiment, since the mechanically rotating spark gap is used as the high-speed switching device which switches in synchronism with the current blocking period by the thyristor, the current-limiting resistor used heretofore can be eliminated and hence the power loss can be removed substantially. By varying the frequency of the AC power source and turning on and off the thyristor, the occurrence frequency of the impulse high voltage can be very easily changed in the wide range.

[Third Embodiment]

Figure 14:
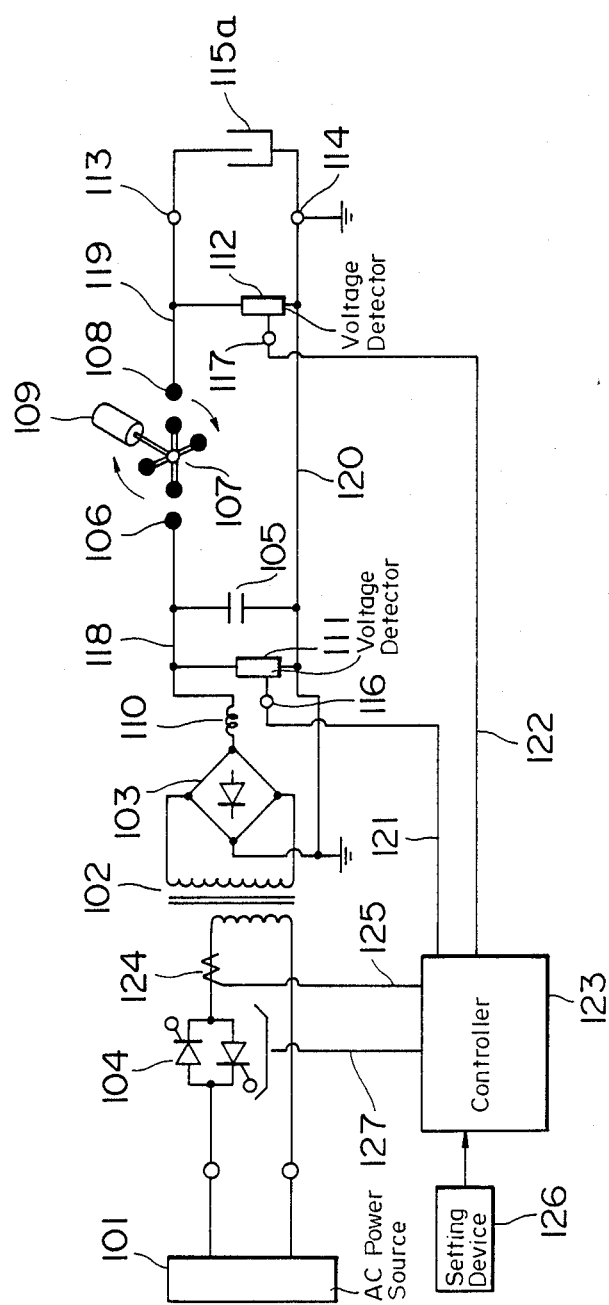
FIG. 14 is a circuit diagram of an impulse high voltage generator connected with an electrostatic precipitator as a load in FIG. 6 and FIGS. 15(A) to 15(F) are timing charts of operation thereof, respectively.
Figure 16:
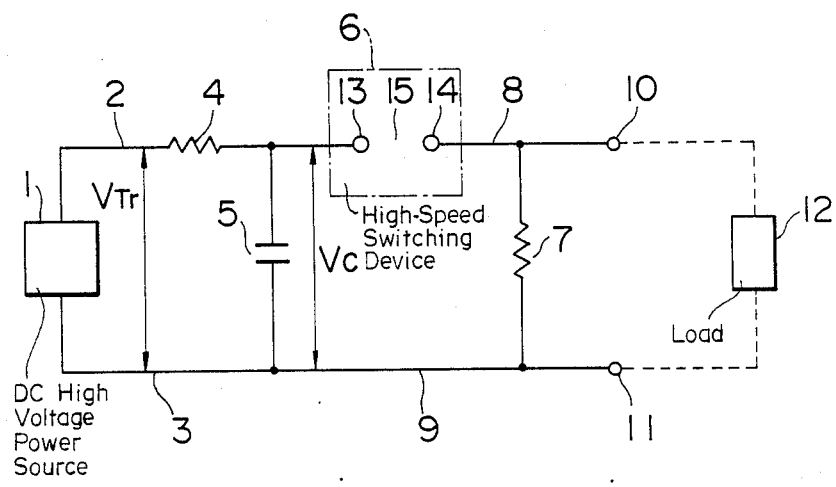
FIGS. 16 and 17 are circuit diagrams of conventional impulse high voltage generators.
Figure 17:
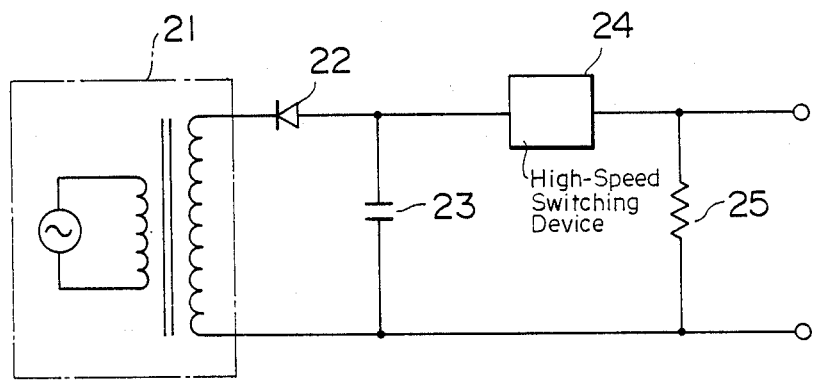
Figure 18:
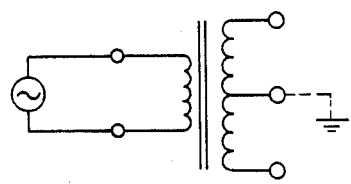
FIG. 18 is a circuit diagram showing an example of a conventional step-up transformer.

FIG. 14 shows an impulse high voltage generator in which an electrostatic precipitator (hereinafter referred to as EP) 115a is connected in place of the load 115 connected between the terminal 113 and the ground terminal 114 in the above embodiment of FIG. 6. In FIG. 14, like elements to those shown in FIG. 6 are designated by like numerals and description thereof is omitted.

In FIG. 14, the capacitor 105 for forming the impulse high voltage is charged and the impulse high voltage is supplied to the EP 115a in synchronism with the timing that the mechanical rotating spark gap conducts. At this time, the timing that the spark gap conducts is a timing that the capacitor is charged, that is, a period excluding a timing that the thyristor is fired. More particularly, the spark gap conducts when the thyristors 104 are turned off. Accordingly, the rush current into the EP 115a from the DC high voltage generator is prevented.

FIGS. 15(A)–(F) show voltage waveforms in various operations. Since the EP 115a possesses a characteristic combined a capacitive load with a resistive load in parallel, the EP 115a is applied with a pulse-like high voltage when the mechanical spark gap conducts and the voltage across the EP is gradually reduced in non-conductive state.

FIGS. 15(A), (B) show an example of a voltage waveform and a current waveform produced from the rectifier 103 when the charging timing is adjusted to vary the pulse frequency by thinning the firing for the thyristor 104 of the impulse high voltage generator. In FIGS. 15(C), (D), since the capacitor 105 is not charged during the cycle that the firing for the thyristor 104 is thinned in the normal state, the mechanical spark gap does not conduct even in the timing that the spark gap conducts intrinsically since a voltage difference $Vc - V_{ESP}$ between the capacitor 105 and the EP 115a is small. Accordingly, the pulse frequency can be varied depending on the cycle that the firing for the thyristor 104 is thinned.

The apparatus as shown in FIG. 14 had a drawback that the pulse occurrence frequency can not be adjusted even if the firing frequency for the thyristor 104 is adjusted depending on the current - voltage characteristic of the EP.

More particularly, in the case where the collecting dust of the EP is high resistive, when the current consumed in the EP is increased, an unusual phenomenon such as the reverse ionization occurs in the dust layer of the EP. Thus, since reactive current flows in the space of the EP, an apparent resistive load element of the EP is very small and the EP operates in low voltage and high current, thereby reducing the precipitation efficiency.

Accordingly, when the above pulse power source operates while suppressing the reverse ionization, it is required to reduce average current while maintaining the high peak pulse voltage. It can be performed by reducing the pulse occurrence frequency.

However, with the apparatus as shown in FIG. 14, if the reverse ionization occurs in the case of high resistive dust, the electrical resistance at the side of EP is greatly reduced. Accordingly, even if the capacitor 105 is not charged, the voltage difference $V_c - V_{ESP}$ between the voltage of the capacitor 105 and the voltage of EP is increased with the lapse of time as shown by the voltage waveforms of FIGS. 15(E) and (F) and the EP 115a conducts with the capacitor 105 being discharged at the timing that the mechanically rotating spark gap conducts. Consequently, the pulse frequency is not decreased and large current flows through the EP 115a, thereby continuing the reverse ionization condition.

FIGS. 15(E) and (F) show an example of voltage wavevforms in which the number of times of turning on the thyristor 104 is thinned to one-third. The voltage of the capacitor 105 is discharged until the voltage difference between the capacitor 105 and the EP 115a is below a certain level. Accordingly, the mechanically rotating spark gap conducts at cycles where the turning-on of the thyristor is thinned.

The present embodiment shows the impulse high voltage generator which improves the above problem and can change the pulse frequency exactly for the high resistive dust EP.

Figure 11:
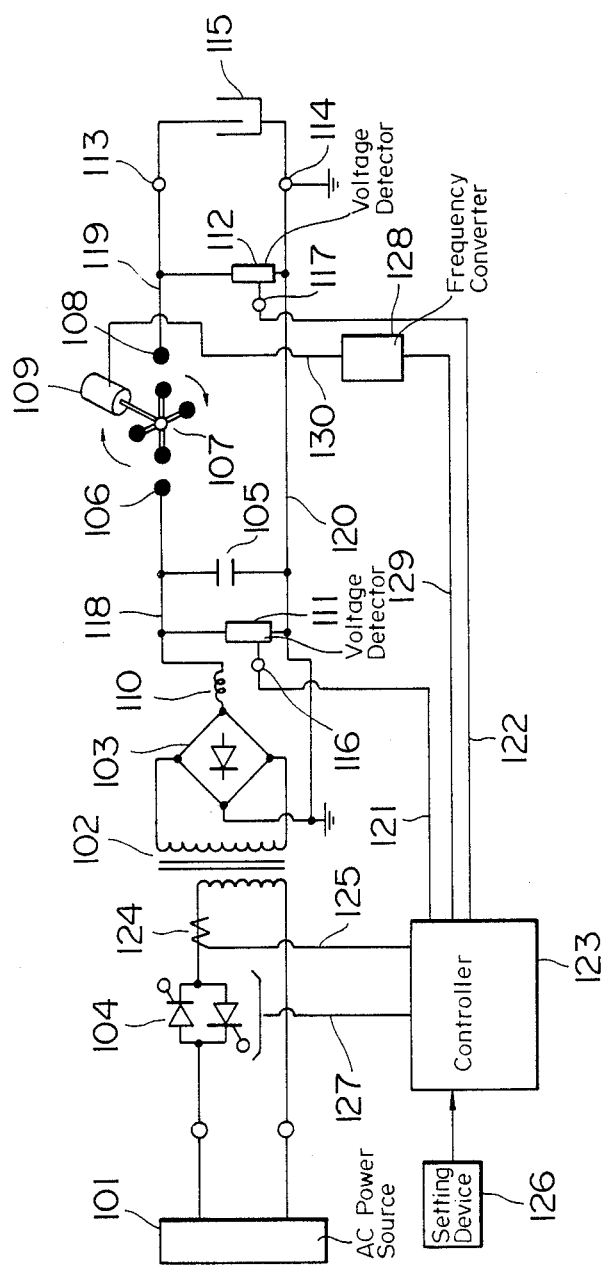
FIG. 11 is a circuit diagram of an impulse high voltage generator according to a third embodiment of the present invention.

FIG. 11 shows a configuration of the present embodiment, in which like elements to those of FIG. 14 are designated by like numerals.

The embodiment of FIG. 11 is different from that of FIG. 14 in that there are provided a synchronous motor 109 which can rotate at the synchronous speed determined by the frequency of the AC power source and a frequency converter 128 such as an inverter which can reduce the input power frequency of the synchronous motor 109 to a frequency obtained by dividing the input power frequency by the integral number and the motor 109 and the converter 128 can be controlled by the controller 123.

FIG. 12(A) shows a waveform of the output voltage Vr of the full-wave rectifier 103 in which the frequency is not changed. Tf represents a half cycle ($\frac{1}{2}f$) of the frequency f of the AC power source and Ts represents a period of no firing the thyristor 104, that is, a period of blocking current at low voltage side. When the rotating electrode 107 of the spark gap is mounted on the output shaft of the syncyronous motor 109 at a proper angle, the timing that the rotating electrode 107 comes nearest to the input electrode 106 and the output electrode 108 can be set within the period shown by Ts of FIG. 12(A).

When an axial line connecting between the input electrode 106 and the output electrode 108 is substantially aligned with an axial line connecting between two opposed poles of the rotating electrode 107 so that the rotating electrode 107 comes nearest to the input electrode 106 and the output electrode 108 and the pulse forming capacitor 105 is charged to a voltage enough to generate spark between the gap, the mechanically rotating spark gap forming a high-speed switching device conducts, that is, switches through spark discharge.

The present embodiment uses a four-pole motor as the synchronous motor 109, which rotates at 1500 or 1800 rpm for frequency f=50 or 60 Hz, and therefore the output shaft or the rotor of the motor makes one rotation for two cycle of the AC power source. That is, since there are four switch timings in the gap when the rotor makes one rotation, the spark gap switches once for each a half cycle of the AC power frequency in synchronism with the frequency of the AC power source.

If the capacitor 105 is selected to have a capacitance so that the capacitor 105 is charged to a desired voltage Vc during a half cycle of the power frequency, the current blocking period of the low voltage side power control thyristor 104 as shown by Ts of FIG. 12(A) can be formed. Accordingly, if the switch timing of the spark gap is adjusted and set to the current blocking period, the spark gap is synchronized with the frequency of the AC power source. Furthermore, the high voltage pulse is stably generated repeatedly without rush current into the load from the high voltage charging power source. At this time, the current Ic from the high voltage charging power source is reduced to zero prior to the switching timing of the spark gap as shown in FIG. 12(B) and does not rush into the load continuously when the spark gap switches.

FIG. 12(D) shows a waveform of the voltage $V_{ESP}$ of the EP 115a. When the mechanically rotating spark gap conducts, the voltage $V_{ESP}$ of EP increases to a peak pulse voltage $V_{PESP}$ in a moment. The voltage thereafter falls to the same voltage Vd as that of the capacitor 105 and is then reduced through the resistive element within EP gradually.

FIGS. 13(A), (B), (C) and (D) show an example of waveforms in which the firing cycle of the thyristor 104 is thinned to 1/n where n is an integral number and in the figure n=3.

In this case, the timing period for charging the capacitor is $Tf = n/2f$. The rotational number of the synchronous motor 109 converted by the frequency converter 128 is set so that the timing period Tf' that the rotating spark gap conducts is Tf'=Tf, and the switching time of the rotating spark gap is set in the non-conductive period Ts of the thyristor. Thus, the operation can be attained without any rush current of the charged current of the DC high voltage into the side of the EP 115a.

When the freqeuncy converter 128 is perfectly synchronized with the AC power source for the DC high voltage power source, the charging timing period Tf and the spark gap conducting timing period Tf' have a relation of Tf=Tf', although a general purpose inverter is used as the frequency converter 128, the perfect synchronization can not be attained even if the relation of Tf=Tf' is set.

However, in this case, as shown in FIG. 13(E), the controller 123 monitors the waveform of the voltage Vc across the capacitor 105 and applies a signal to the frequency converter 128 to control the timing period Tf' so that the time cycle Tc from the beginning of charge to the start of discharge is set within Tcmin≦Tc≦Tcmax. That is, when $Tc=Tcmin+\alpha$ where $\alpha$ is a set point margin, the timing is set to $Tf'=Tf+\Delta T$, or when $Tc=Tcmax-\alpha$, the timing is set to $Tf'=Tf-\Delta T$. Thus, it is controlled to reduce $\Delta T$ to zero, that is $\Delta T\rightarrow 0$ so that Tf'=Tf. In this manner, the conducting period of the rotating spark gap can be set to the non-conductive period Ts of the thyristor.

As described above, according to the present embodiment, the rotational number of the mechanically rotating spark gap is reduced in synchronism with the power frequency for firing the thyristor and consequently the pulse occurrence frequency of the impulse high voltage generator can be exactly reduced irrespective of the load characteristic of EP. Accordingly, since the EP can operate with small average current without reducing the pulse peak voltage for the high resistive dust, the reverse ionization can be suppressed and the precipitation efficiency can be increased.

We claim:
1. An impulse high voltage generator comprising:
   a step-up transformer having a primary winding and a secondary winding for stepping up an AC voltage from an AC power source;
   a thyristor connected to said primary winding of said transformer for controlling the AC voltage supplied said transformer by varying a firing angle;
   a full-wave rectifier connected to said secondary winding of said transformer and having an output;
   a capacitor connected to said output of said rectifier and charging to a DC voltage;
   high-speed switching means connected to said capacitor for selectively supplying said DC voltage to a load as an impulse high voltage;
   a discharging resistor connected to said switching means;
   setting means for setting an occurrence frequency of said impulse high voltage; control means for triggering said thyristor at a firing angle in accordance with the occurrence frequency set by said setting means to charge said capacitor with said DC voltage and for controlling conduction of said high-speed switching means during non-conductive periods of said thyristor to discharge said capacitor so that the impulse high voltage is generated to said discharging resistor;
   said control means triggering said thyristor in the range of 90° to 180° and 270° to 0° of the AC voltage, said control means controlling the conduction of said high speed switching means to be only in the range of 0° to 90° and 180° to 270° of the AC voltage, said control means thereby enabling conduction of said thyristor and conduction of said high-speed switching means at different times within a single half cycle of the AC voltage.

2. An impulse high voltage generator according to claim 1, wherein said high-speed switching means comprises a mechanically rotating spark gap including,
   rotating electrodes mounted on a common rotating shaft at intervals of 90°, and
   a synchronous motor for driving said rotating electrodes at a rotational speed in which said rotating electrodes rotate 90° for each half cycle of said AC voltage developed by the AC power source.

3. An impulse high voltage generator comprising:
   a step-up transformer having a primary winding and a secondary winding for stepping up an AC voltage from an AC power source;
   a thyristor connected to said primary winding of said transformer for controlling the AC voltage supplied by said transformer by varying a firing angle;
   a full-wave rectifier connected to said secondary winding of said transformer and having an output;
   a capacitor connected to said output of said rectifier and charging to a DC voltage, a mechanically rotating spark gap connected to said capacitor for supplying a voltage generated in said capacitor to an output terminal;
   a synchronous motor for driving said rotating spark gap;
   frequency converting means for driving said motor in synchronization with a frequency (f) of said AC power source or a frequency obtained by dividing the frequency of the AC power source by an integral number (a conversion ratio);
   setting means for setting up an occurrence frequency of an impulse high voltage; and
   control means, responsive to said setting means, for triggering said thyristor at a firing angle in accordance with the occurrence frequency set by said setting means to charge said capacitor and for controlling the conversion ratio n of said frequency converting means to drive said rotating spark gap to conduct during a non-conductive period of said thyristor to supply the voltage developed across said capacitor to said output terminal to develop an impulse high voltage thereat;
   said control means triggering said thyristor in the range of 90° to 180° and 270° to 0° of the AC voltage, said control of the conversion ratio n of said frequency converting means by said control means allowing conduction of said rotating spark gap only in the range of 0° to 90° and 180° to 270° of the AC voltage, said control means thereby enabling conduction of said thyristor and conduction across said rotating spark gap at different times within a single half cycle of the AC voltage.

4. An impulse high voltage generator according to claim 3, wherein said control means controls said frequency converting means to synchronize an output of said converting means to the frequency of said AC power source.

* * * * *